United States Patent
Glodde et al.

(10) Patent No.: US 9,671,694 B1
(45) Date of Patent: Jun. 6, 2017

(54) WET STRIPPABLE GAP FILL MATERIALS

(71) Applicants: INTERNATIONAL BUSINESS MACHINES CORPORATION, Armonk, NY (US); Shin-Etsu Chemical Co., Ltd., Tokyo (JP)

(72) Inventors: Martin Glodde, Pine Brook, NJ (US); Ratnam Sooriyakumaran, San Jose, CA (US); Seiichiro Tachibana, Tokyo (JP); Hoa D. Truong, Los Altos, CA (US)

(73) Assignees: INTERNATIONAL BUSINESS MACHINES CORPORATION, Armonk, NY (US); SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/282,238

(22) Filed: Sep. 30, 2016

(51) Int. Cl.
  *G03F 7/11* (2006.01)
  *G03F 7/09* (2006.01)
  *C09D 125/18* (2006.01)
  *C09D 133/14* (2006.01)
  *G03F 7/20* (2006.01)
  (Continued)

(52) U.S. Cl.
  CPC ........... *G03F 7/094* (2013.01); *C09D 125/18* (2013.01); *C09D 133/14* (2013.01); *G03F 7/162* (2013.01); *G03F 7/168* (2013.01); *G03F 7/2004* (2013.01); *G03F 7/2006* (2013.01); *G03F 7/2008* (2013.01); *G03F 7/2016* (2013.01); *H01L 21/3081* (2013.01); *H01L 21/3083* (2013.01)

(58) Field of Classification Search
  CPC ..... G03F 7/11; G03F 7/30; G03F 7/40; H01L 21/0274; H01L 21/0276
  USPC ...... 430/270.1, 271.1, 273.1, 322, 325, 329, 430/330, 331
  See application file for complete search history.

(56) References Cited

U.S. PATENT DOCUMENTS 5,370,969 A   12/1994  Vidusek
8,007,979 B2   8/2011  Takei et al.
(Continued)

OTHER PUBLICATIONS

K. Komura et al., "Spin-on organic hardmask for topo-patterned substrate," Proc. of SPIE, vol. 9051, 905115, 2014, 7 pages.
(Continued)

*Primary Examiner* — Amanda C Walke
(74) *Attorney, Agent, or Firm* — Cantor Colburn LLP; Vazken Alexanian

(57) ABSTRACT

A layered structure includes a substrate; an underlayer including a reversibly crosslinked polymer and/or oligomer interconnected by ester functionalities; a silicon-containing mask overlaying the underlayer; and a photoresist overlaying the silicon-containing hardmask layer. Also described are multilayer lithographic processes and processes of forming the underlayer, which generally includes coating an underlayer composition onto a surface of the substrate at a thickness effective to provide a planar upper surface, wherein the underlayer composition includes a polymer including terminal alcohol groups, a multifunctional anhydride, and a solvent. The underlayer composition is heated to a temperature to effect a crosslinking reaction between the multifunctional anhydride and the terminal alcohol groups to form the ester functionalities, which can be selectively removed (reversibly crosslinked) using a wet etchant.

17 Claims, 7 Drawing Sheets

(51) Int. Cl.
*G03F 7/16* (2006.01)
*H01L 21/308* (2006.01)

(56) References Cited

U.S. PATENT DOCUMENTS

| | | | | |
|---|---|---|---|---|
| 8,323,870 | B2* | 12/2012 | Lee | G03F 7/0382 |
| | | | | 430/270.1 |
| 8,986,921 | B2* | 3/2015 | Edelstein | G03F 7/094 |
| | | | | 430/311 |
| 9,093,263 | B2 | 7/2015 | Wu et al. | |
| 9,209,067 | B2 | 12/2015 | Park et al. | |
| 9,235,124 | B2 | 1/2016 | Allen et al. | |
| 9,348,228 | B2 | 5/2016 | Glodde et al. | |
| 9,362,120 | B2* | 6/2016 | Su | H01L 21/0274 |
| 2005/0031964 | A1* | 2/2005 | Babich | G03F 7/091 |
| | | | | 430/5 |
| 2006/0234158 | A1 | 10/2006 | Hatakeyama | |
| 2008/0102400 | A1* | 5/2008 | Huang | G03F 7/0757 |
| | | | | 430/270.1 |
| 2012/0155474 | A1* | 6/2012 | Kessler | H04L 49/3072 |
| | | | | 370/393 |
| 2012/0223418 | A1* | 9/2012 | Stowers | C23C 18/06 |
| | | | | 257/632 |
| 2014/0110846 | A1* | 4/2014 | Arnold | G03F 7/0035 |
| | | | | 257/758 |
| 2015/0187565 | A1 | 7/2015 | Su et al. | |
| 2015/0210829 | A1 | 7/2015 | Shibayama et al. | |

OTHER PUBLICATIONS

M. Glodde et al., "Systematic studies on reactive ion etch-induced deformations of organic underlayers," Proc. of SPIE, vol. 7972, 797216, 2011, 8 pages.

S. Burns et al., "Silicon containing polymer in applications for 193 nm high NA lithography processes," Proc. of SPIE, vol. 6153, 61530K, 2006, 12 pages.

E.S. Moyer, et al., "Silicon-Containing Materials for Sub-65 nm Etch," Semiconductor International, Sep. 2007 (www.semiconductor.net), 4 pages.

Meador, Jim D., et al., "New Materials for 193-nm Trilayer Imaging," Proc. of SPIE, vol. 5376 2004, 10 pages.

Weigand, Michael et al., "Evaluating spin-on carbon materials at low temperatures for high wiggling resistance," Proc. of SPIE, vol. 8685, 2013, 9 pages.

* cited by examiner

WET STRIPPABLE GAP FILL MATERIALS

BACKGROUND

The present invention relates to formation of semiconductor structures and more particularly, to wet strippable gap fill materials for multilayer patterning schemes.

Various applications in 10, 7, 5 nanometer (nm) lithography and beyond require the fill of and planarization over small features or crevices printed and etched into various lithographic substrates. The dimensions of these features shrink with the lithographic node, which generally means that it becomes more and more challenging to fill these features and crevices. The removal of the gap fill materials after processing of the lithographic steps involving them typically involves reactive ion etch (RIE).

Typically, underlayers such as organic planarizing layers (OPL) materials, also known as spin-on carbon materials, as well as spin on silicon containing materials are irreversibly crosslinked during the post apply bake (PAB) in order to prevent their dissolution during the application of the next spin-coated layer.

SUMMARY

In one or more embodiments, a layered structure includes a substrate; an underlayer including a reversibly crosslinked polymer and/or oligomer interconnected by ester functionalities; a silicon-containing mask overlaying the underlayer; and a photoresist overlaying the silicon-containing hardmask layer.

In one or more embodiments, a multilayer lithographic method includes, coating an underlayer composition onto a surface of a substrate at a thickness effective to provide a planar upper surface, wherein the underlayer composition includes a polymer and/or oligomer including terminal alcohol groups, a multifunctional anhydride, and a solvent. The underlayer is heated to a temperature to effect a crosslinking reaction between the multifunctional anhydride and the terminal alcohol groups to form an ester functionality. A silicon-containing hardmask is coated on the underlayer layer. A photoresist is coated on the silicon-containing hardmask. The photoresist is patterned with a light source and a developer. The photoresist pattern is transferred into the silicon-containing hardmask. The silicon-containing hardmask pattern is transferred into the underlayer, wherein transferring includes contacting the underlayer with a wet etchant and removing the underlayer at a rate greater than the silicon containing hardmask. The patterned underlayer is transferred into the substrate.

In one or more embodiments, method for forming an underlayer in a multilayer lithography patterning scheme includes coating an underlayer composition onto a surface of a substrate at a thickness effective to provide a planar upper surface, wherein the underlayer composition includes a crosslinkable polymer including terminal alcohol groups, a multifunctional anhydride, and a solvent. The underlayer composition is heated to a temperature to effect a reversible crosslinking reaction between the multifunctional anhydride and the terminal alcohol groups to form an ester functionality and for a period of time to form a film insoluble in cyclohexanone.

BRIEF DESCRIPTION OF THE DRAWINGS

The following detailed description, given by way of example and not intended to limit the description solely thereto, will best be appreciated in conjunction with the accompanying drawings, wherein like reference numerals denote like elements and parts, in which.

DETAILED DESCRIPTION OF THE DRAWINGS

Figure 1:
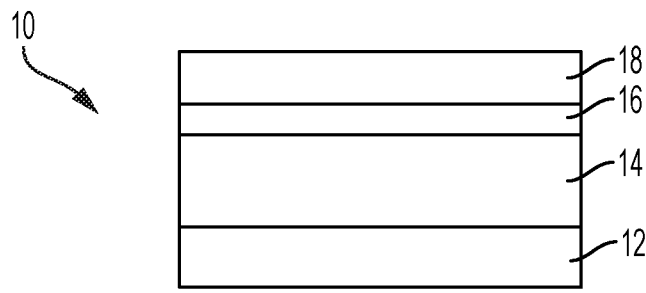
FIG. 1 depicts a cross sectional side view showing an as deposited trilayer scheme suitable for lithographic patterning of a substrate in accordance with one or more embodiments.

Multilayer patterning schemes such as trilayer schemes enable the extension of ArF/193 nm and EUV photolithography by increasing the numerical aperture (NA) of the exposure system. The result is a smaller depth of focus, subsequently requiring the use of thinner photoresists.

Multilayer patterning schemes such as the trilayer scheme generally includes a photoresist, a silicon-containing hardmask underlying the photoresist, and an underlayer underlying the silicon-containing hardmask and overlying a substrate to be patterned. The function of the underlayer is generally to fill in pre-existing patterning on the substrate, such as previously patterned vias, and to enable lithographic patterning of the next level. Patterning of the silicon-containing hardmask and underlayer typically includes reactive ion etch (RIE) chemistry. In particular, the silicon-containing hardmask and the underlayer are generally configured to provide alternating etch selectivities towards fluorine- and oxygen-containing RIE chemistry to allow for highly selective pattern transfer from the photoresist on top of the silicon-containing hardmask into the substrate below the underlayer. In some embodiments, a reductive RIE chemistry can be used, e.g., $N_2/H_2$.

As the underlayer is typically spin coated onto the substrate, it must have excellent gap filling properties. In addition, underlayers are usually irreversibly crosslinked during the post apply bake (PAB) in order to prevent their dissolution during the application of the next spin-coated layer, e.g., the silicon-containing hardmask layer. However, in some applications, the RIE etching process damages the underlying substrate and it is more desirable to utilize a less aggressive etching process. For example, wet etching processes have been explored but have generally been found to result in delamination of the irreversibly crosslinked organic underlayer or to result in little-to-no dissolution because of the degree of irreversible crosslinking in the organic underlayer. It has been discovered that providing reversibly crosslinked ester functionalities within the crosslinked underlayer results in effective dissolution rates in common wet etching chemistries yet without any deleterious effect on intermixing. Exemplary wet etching chemistries effective to reversibly crosslink the so-formed ester functionalities include, without limitation, an acidic solution, or a basic solution in a polar solvent and or a polar solvent and water mixture, or combinations thereof.

In one or more embodiments, the underlayer is a spin coat formulation that includes a crosslinkable polymer or a glassy oligomer (e.g. molecular glasses) having multiple (at least two) terminal alcohol groups, a cross-linker such as a multifunctional (at least di-functional) anhydride reactive with the terminal alcohol groups to form ester groups within the crosslinked polymer structure, and a solvent. The ester groups can be readily hydrolyzed using wet etch solvent chemistry such as an acidic solution, or a basic solution in a polar solvent or a polar solvent and water mixture, or combinations thereof. By way of example, the ester functionalities can undergo base hydrolysis using a wet etchant chemistry including tetramethyl-ammonium hydroxide (TMAH) in a glycol solution, thereby providing effective dissolution of the underlayer with wet etch solvents. As will be discussed in greater detail herein, the crosslinkable polymer or the oligomer can be carbon-based or silicon-based polymers including at least two or more terminal alcohol groups that utilize reversible crosslinkers for formation of the ester functionality. Effective crosslinking and wet stripping without delamination has been observed.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

To facilitate understanding, FIG. 1 shows a semiconductor structure 10 including a multilayer patterning scheme commonly utilized for mass production of advanced semiconductor devices. The multiple layers generally include a substrate 12, which can include topography such as vias, a gap fill underlayer 14 overlaying the substrate, a silicon-containing hardmask 16 overlaying the underlayer layer 14, and a photoresist 18 overlaying the silicon-containing hardmask 16. Optionally, an organic bottom anti-reflective coating can be disposed intermediate the photoresist layer 18 and the silicon-containing hardmask 16. In one or more embodiments, the silicon containing hardmask can include anti-reflective functionality, i.e., SiBARCs.

Examples of suitable substrates 12 that can employed include, but are not intended to be limited to, semiconductor chips, wafers, circuit boards, interconnect structures, metals and other like substrates. In one or more embodiments, the substrate 12 is composed of or contains a semiconducting material such as Si, Ge, GeSi, GaAs, InAs, InP and other III/V compounds as well as SiO2, $Si_3N_4$, SiC. The semiconducting material can be doped and/or undoped. The substrate can contain active device regions or wiring regions such as are typically found in integrated circuit chips, which can include varying topography. For clarity, such device or wiring regions are not shown in the drawings, but nevertheless, can be present in substrates used in the processes of the invention.

The underlayer 14 is a carbon-based or silicon-based spin-on material having a dielectric constant of about 4.0 or less. In one or more embodiments, the dielectric constant can be less than about 3.0. In one or more embodiments, the carbon based spin-on material can contain silicon. In one or more embodiments, the underlayer is an organic planarizing layer (OPL).

The carbon-based and silicon based spin-on materials include a crosslinkable polymer or an oligomer having at least two terminal alcohol groups, a cross-linker such as a multifunctional anhydride (at least difunctional) reactive with the terminal alcohol groups to form ester groups within the crosslinked polymer structure, and a solvent. The crosslinkable polymer/oligomer is not intended to be limited and can include homopolymers, molecular glasses, copolymers, terpolymers, or the like provided the crosslinkable polymer/ oligomer includes at least two terminal alcohol groups. The terminal alcohol groups can be a primary alcohol, a secondary alcohol, a tertiary alcohol, or mixtures thereof, i.e., an OH group bonded to a saturated carbon, which can be cyclic or non-cyclic. The terminal alcohol group is a reactive moiety and provides a site for reaction with the cross-linker.

Exemplary materials defining the crosslinkable polymer of the underlayer that can be employed in the invention include, but are not limited to, those polymers described in U.S. Pat. No. 6,818,381, incorporated herein by reference in its entirety, which describes compositions suitable for forming planarizing underlayers for multilayer lithographic processes, characterized by the presence of (A) a polymer containing: (i) cyclic ether moieties, (ii) saturated polycyclic moieties, and (iii) aromatic moieties for compositions not requiring a separate crosslinker, or (B) a polymer containing: (i) saturated polycyclic moieties, and (ii) aromatic moieties for compositions requiring a separate crosslinker. The compositions provide optical, mechanical and etch selectivity properties, and can be utilized in lithographic processes using radiation less than 200 nm in wavelength to configure underlying material layers.

Other exemplary materials are described in U.S. Patent Application Pub. No. 2006/0134547A1, incorporated herein by reference in its entirety, described various acrylate polymers including at least one substituted or unsubstituted naphthalene or naphthol moiety including mixtures thereof as suitable underlayer. Additionally, U.S. Pat. No. 8,999,652, incorporated herein by reference in its entirety, describes various silsequioxanes suitable for use in the present invention including polyhedral oligomeric silsequioxanes (POSS) provided at least two terminal alcohol groups as previously defined is provided in one or more of the R substituents. Typical POSS materials have 4-12 polygonal faces.

The underlayer 14 can be deposited to a thickness such that an upper surface thereof is substantially planar. A planar surface assures that the image to be patterned in the overlaying photoresist and silicon-containing hardmask layers will be correctly focused. A thickness of the underlayer film is typically selected arbitrarily provided the surface is substantially planar, but in one or more embodiments is from 30 nanometers (nm) to 20,000 nm, and in one or more other embodiments, from 50 nm to 15,000 nm.

In one or more embodiments, the crosslinkable polymers generally have a weight average molecular weight, before any crosslinking reaction, of at least about 1,000 Daltons and in one or more other embodiments, a weight average molecular weight of about 5000 to about 50,000 Daltons.

In one or more embodiments, the underlayer composition can further include an acid generator for inducing crosslinking of the inventive polymers. The acid generator can be an acid generator compound that liberates acid upon thermal treatment. A variety of known thermal acid generators can be suitably employed, such as 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236, incorporated by reference in their entireties.

If desired, a radiation-sensitive acid generator can be employed as an alternative to a thermally activated acid generator or in combination with a thermally activated acid generator. Examples of suitable radiation-sensitive acid generators are described in U.S. Pat. Nos. 5,886,102 and 5,939,236, incorporated by reference in their entireties. The radiation-sensitive acid generator should be compatible with the other components of the planarizing underlayer composition. Where a radiation-sensitive acid generator is used, the cure (crosslinking) temperature of the composition can be reduced by application of appropriate radiation to induce acid generation, which in turn catalyzes the crosslinking reaction. Even if a radiation-sensitive acid generator is used, it is preferred to thermally treat the composition to accelerate the crosslinking process (e.g., for wafers in a production line).

In one or more embodiments, the multifunctional crosslinker is a difunctional anhydride. In one or more embodiments, the difunctional anhydride is a tetracarboxylic acid dianhydride represented by formula (i):

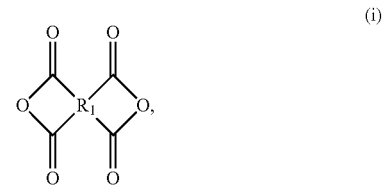

wherein $R_1$ is a tetravalent group having at least 4 carbons. Exemplary tetracarboxylic acid dianhydride include the dianhydride of pyromellitic acid (also referred to herein as the dianhydride of benzene 1, 2, 4, 5,-tetracarboxylic acid), 2,2-bis(3,4-dicarboxyphenyl) propane, bis(3,4-dicarboxyphenyl) ether, bis(3,4-dicarboxyphenyl) sulfone, 3,3',4,4'-benzophenone tetracarboxylic acid, 3,3', 4,4'-biphenyltetracarboxylic acid, 2,2',3,3'-biphenyltetracarboxylic acid, 1,2,5,6-naphthalene tetracarboxylic acid, 2,3,6,7-naphthalene tetracarboxylic acid, 3,4,9,10-perylene tetracarboxylic acid, 2,2',6,6'-biphenyl tetracarboxylic acid, 2,2-bis(3,4-dicarboxyphenyl) hexafluoropropane or others.

The molar ratio of the dianhydride to the polymer can be in the range of from about 5:95 to about 70:30. In one or more other embodiments, the molar ratio can be in the range of from about 10:90 to about 50:50, and in still one or more other embodiments, the molar ratio can be in the range of from about 15:85 to about 45:55.

The casting solvent can be any solvent known in the art that effectively solubilizes the underlayer polymer and breaking group without reacting with the components or interfering in the crosslinking process or patterning process. The solvent can be, for example, any solvent conventionally used in spin coat methods, e.g., ethers, glycol ethers, aromatic hydrocarbons, ketones, and esters commonly used for such a purpose. Some particular examples of casting solvents include 3-pentanone, methyl isobutyl ketone (MIBK), propylene glycol methyl ether (1-methoxy-2-propanol), methyl cellusolve (2-methoxyethanol), butyl acetate, 2-ethoxyethanol, propylene glycol methyl ether acetate (PG-MEA), propylene glycol propyl ether (1-propoxy-2-propanol, Dowanol PnP), 4-heptanone, 3-heptanone, 2-heptanone, N,N-dimethylformamide, N,N-dimethylacetamide, anisole, ethyl lactate, cyclohexanone, cellusolve acetate (ethylene glycol ethyl ether acetate), diglyme (2-methoxy ethyl ether), ethoxyethylpropionate (EEP), dimethyl sulfoxide, di(propylene glycol) methyl ether (DOWANOL®), di(ethylene glycol) methyl ether, diethylmalonate, diethylene glycol monobutyl ether (DEGBE) and gamma-butyrolactone (GBL). Moreover, any suitable combination of such solvents can be used, e.g., a combination of EEP and GBL.

The silicon-containing hardmask 16 overlaying the organic planarizing layer 12 can be silicon, silicon nitride, silicon carbide, silicon oxide, nitrided silicon carbide, silicon oxynitride, or the like. The silicon-containing hardmask 16 protects the organic underlayer 12 during RIE processing and has an etch selectivity different than underlayer. In one or more embodiments, the silicon containing hardmask is a silicon containing bottom anti-reflective coating ("SiBARC") as previously noted above. Incorporating silicon into the bottom anti-reflective coating results in an anti-reflective coating that provides reflection control but also can function as an etch transfer mask, i.e., a hard mask.

Figure 2:
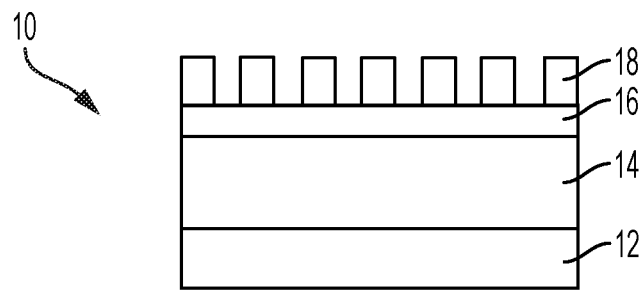
FIG. 2 depicts a cross sectional side view subsequent to pattern transfer of a photoresist layer in the deposited trilayer scheme in accordance with one or more embodiments.

Referring now to FIG. 2, the thin photoresist layer 18 is lithographically patterned. The photoresist layer can include a carbon backbone polymer and include other suitable components such as a solvent and/or photo acid generators. For example, the photoresist can be a chemical amplified resist known in the art. In one or more embodiments, the photoresist layer includes a photo-acid generator distributed in the photoresist layer. When absorbing radiation energy from an exposure process, the photo-acid generator forms a small amount of acid. The resist can include a polymer material that varies its solubility to a developer when the polymer is reacted with this generated acid.

Figure 3:
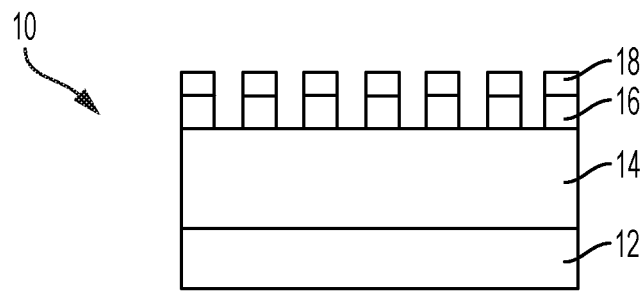
FIG. 3 depicts a cross sectional side view subsequent to pattern transfer into a silicon containing hardmask layer in the deposited trilayer scheme in accordance with one or more embodiments.

In FIG. 3, the silicon-containing hardmask 18 and bottom antireflective layer, if present, is opened with a highly selective etch process, typically a fluorinated reactive ion etch process. The reduction in photoresist thickness as the devices scale to smaller dimensions make the photoresist no longer of capable of acting as a mask for transfer into the substrate. Consequently, the etch selectivity can be similar to that of the silicon containing layer, which generally results in significant photoresist loss and profile degradation.

Figure 4:
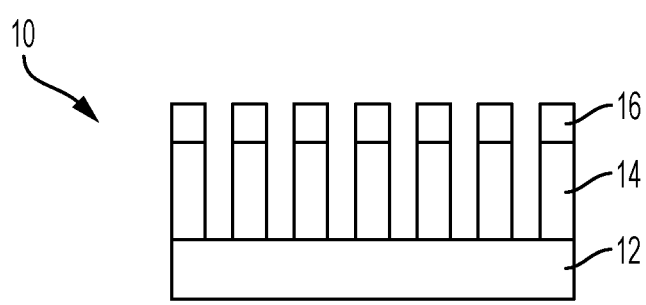
FIG. 4 depicts a cross sectional side view subsequent to pattern transfer into a reversibly crosslinked underlayer in the deposited trilayer scheme utilizing a wet etchant in accordance with one or more embodiments.

In FIG. 4, the pattern in the silicon containing layer is transferred into the organic underlayer 14 utilizing a wet etch process. Previous processing typically utilized an oxygen reactive ion etch process.

Figure 5:
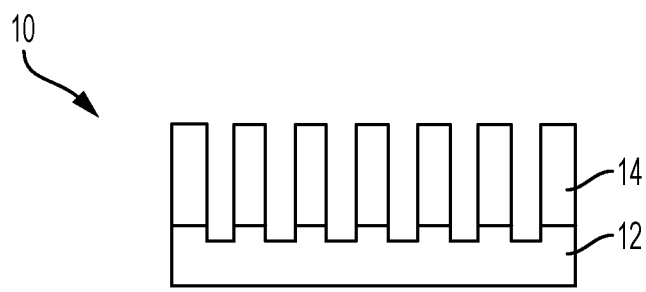
FIG. 5 depicts a cross sectional side view subsequent to pattern transfer into the substrate in accordance with one or more embodiments.

In FIG. 5, the substrate is then patterned with the relief image now present in the organic underlayer. RIE into the substrate can be effected using $CHF_3/CF_4$ chemistry.

As noted above, the underlayer is a spin coat formulation that includes a crosslinkable polymer having at least two terminal alcohol groups, a crosslinker such as a difunctional anhydride reactive with the terminal alcohol groups to form ester groups within the crosslinked polymer structure, and a solvent. The underlayer can effectively be removed using wet etch chemistry such as an acidic solution or a basic solution in a polar solvent or a polar solvent and water mixture, or combinations thereof, which advantageously overcomes the problems associated with the use of RIE processes.

By way of example, the organic underlayer composition can include poly(4-hydroxystyrene-co-2-hydroxyethyl methacrylate), the dianhydride of benzene 1, 2, 4, 5-tetracarboxylic acid, and a solvent such as cyclohexanone. The poly(4-hydroxystyrene-co-2-hydroxyethyl methacrylate is shown below, wherein m:n=ranges from 95:5 to 5:95.

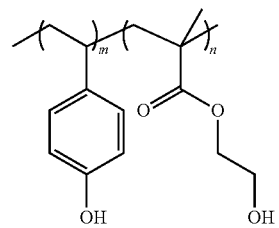

The underlayer is spin coated onto a substrate and heated to a temperature of 140° C., wherein a crosslinking reaction results in the formation of esters. The degree of crosslinking is effective to prevent dissolution upon subsequent spin-on deposition of the silicon containing hardmask solution. Patterning of the organic underlayer, i.e., dissolution of the open underlayer, can be effected utilizing a wet etchant such as 1% tetramethyl ammonium hydroxide (TMAH) in a glycol type solvent after 3 minutes at 40° C. The formation of ester functionality within the resulting crosslinked polymer and subsequent dissolution is represented by general reaction scheme (I) below, which illustrates reaction of the terminal alcohol groups with the anhydride functionalities of the dianhydride.

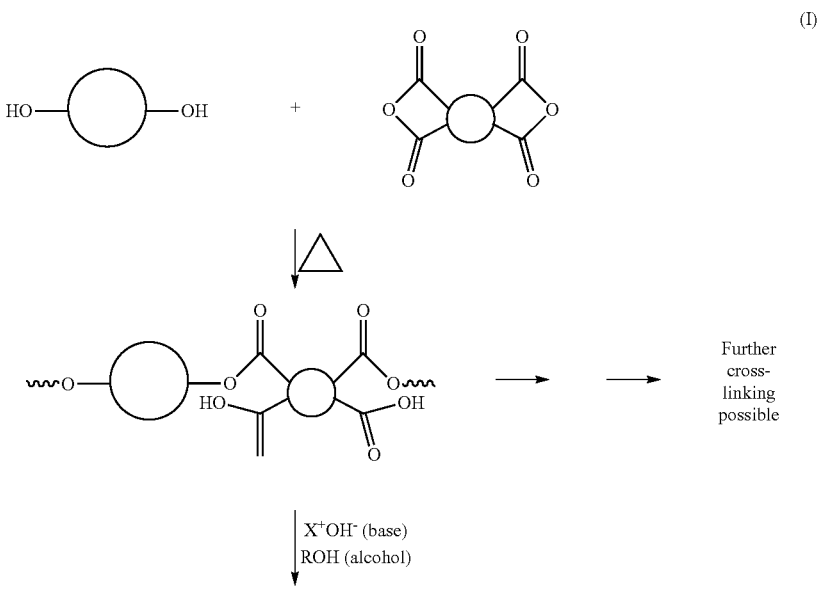

-continued

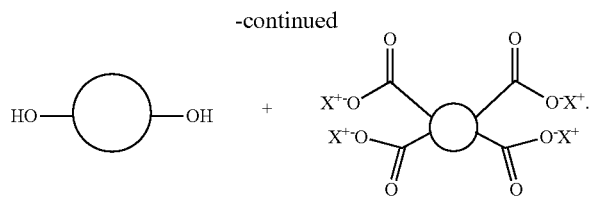

Figure 6:
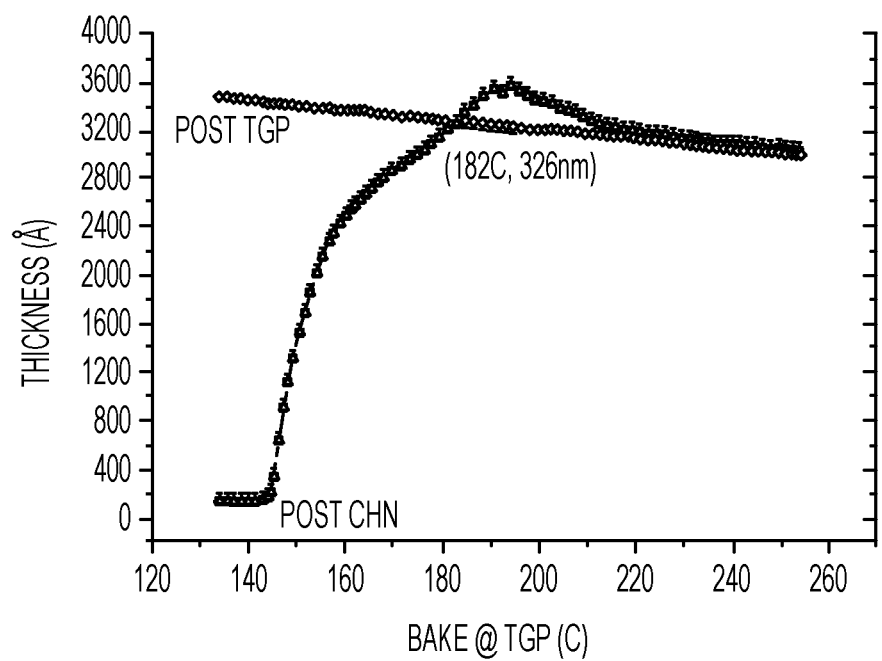
FIG. 6 graphically illustrates thickness as a function of high temperature bake, and the dissolution in cyclohexanone as a function of high temperature of a thin film of poly(4-hydroxystyrene-co-2-hydroxyethyl methacrylate) polymer in the presence of a dianhydride crosslinker.

FIG. 6 graphically thickness as a function of high temperature bake, and the dissolution in cyclohexanone as a function of high temperature bake of a thin film of poly(4-hydroxystyrene-co-2-hydroxyethyl methacrylate) polymer in the presence of a dianhydride crosslinker. As shown, the film was insoluble to cyclohexanone at temperatures greater than about 180° C., which is indicative that substantial cross-linking has occurred and no intermixing will occur upon spin coating of the silicon-containing hardmask layer onto the underlayer. The crosslinked polymer obtained at temperatures greater than 180° C. was removed upon exposure to 1% tetramethyl ammonium hydroxide in propylene glycol methyl ether acetate for 3 minutes at 40° C., which is indicative of the reversibility of the ester functionalized crosslinking.

Figure 7:
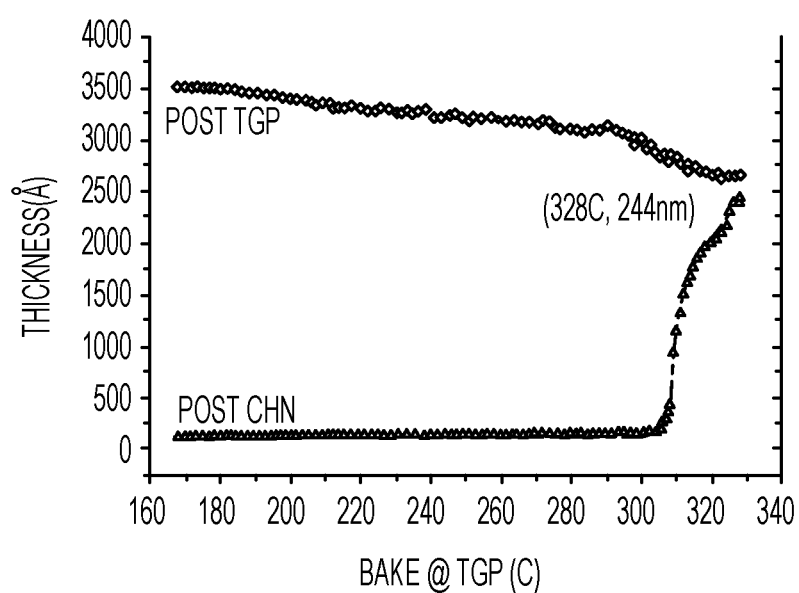
FIG. 7 graphically illustrates thickness as a function of high temperature bake, and the dissolution in cyclohexanone as a function of high temperature bake of a thin film of poly(4-hydroxystyrene-co-2-hydroxyethyl methacrylate) polymer in the absence of a dianhydride crosslinker.

FIG. 7 graphically illustrates thickness as a function of high temperature bake, and the dissolution in cyclohexanone as a function of high temperature bake of a thin film of poly(4-hydroxystyrene-co-2-hydroxyethyl methacrylate) polymer in the absence of a dianhydride crosslinker. As shown, crosslinking in the absence of the dianhydride occurred at a markedly higher temperature of about 330° C. with a significant amount a degradation as evidenced by the thickness loss. The reaction was not reversible, i.e., the crosslinked polymer was insoluble upon exposure to 1% tetramethyl ammonium hydroxide in propylene glycol methyl ether acetate for 3 minutes at 40° C.

Silicon-based planarizing gap fill materials can also be made wet etch soluble in a similar manner. Silsequioxanes includes R groups having a pendant hydroxyl group can be reversibly crosslinked by forming base soluble esters. For example, a silsequioxane gap fill underlayer material of the formula $[RSiO_{3/2}]_8$, wherein the R group includes a primary alcohols as shown below can be crosslinked with dianhydride benzene 1, 2, 4, 5-tetracarboxylic acid to form a reversibly crosslinked polymer that is wet etch soluble.

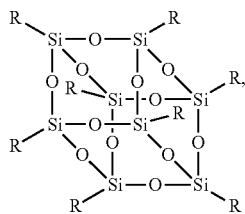

wherein R is:

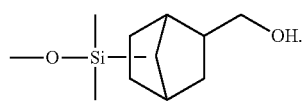

Reaction of the dianhydride with the primary alcohols of the above polyhedral silsequioxane results in the formation of esters within the crosslinked polymer in accordance with generic reactions scheme (I) above.

Figure 8:
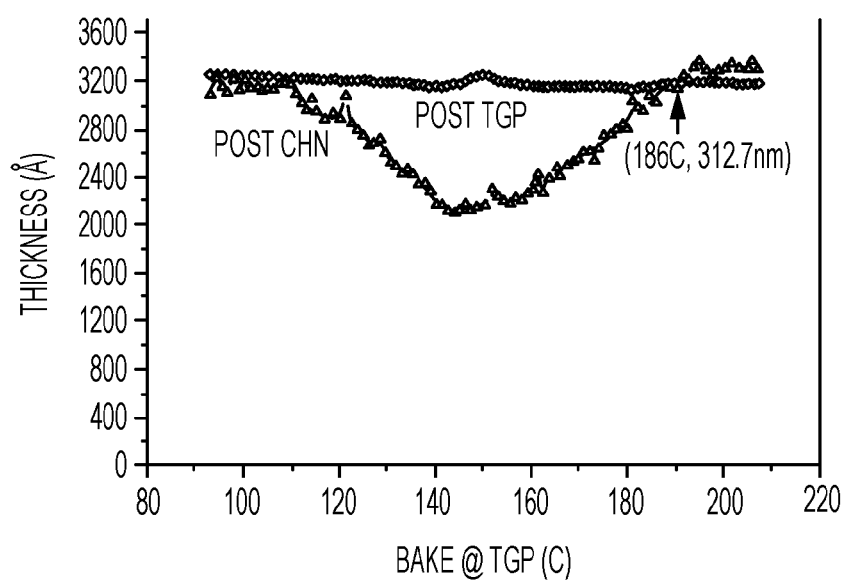
FIG. 8 graphically illustrates thickness as a function of high temperature bake, and the dissolution in cyclohexanone as a function of high temperature bake of a thin film of polyhedral silsequioxane including a primary alcohol group in the presence of a dianhydride.

FIG. 8 graphically illustrates thickness as a function of high temperature bake and the dissolution in cyclohexanone as a function of high temperature bake of a thin film of polyhedral silsequioxane with the primary alcohol group in the presence of a dianhydride crosslinker. As shown, the crosslinked silsequioxane was insoluble to cyclohexanone at temperatures of about 90 to 110° C. with no loss in thickness, which is indicative that no intermixing will occur upon spin coating of the silicon containing hardmask layer onto the underlayer. The crosslinked polymer obtained within this temperature range was removed upon exposure to 1% tetramethyl ammonium hydroxide in propylene glycol methyl ether acetate for 3 minutes at 40° C., which is indicative of the reversibility of the ester functionalized crosslinking.

In another example, a silsequioxane gap fill underlayer material of the formula $[RSiO_{3/2}]_3$, wherein the R group includes a secondary alcohol as shown below can be crosslinked with dianhydride benzene 1, 2, 4, 5-tetracarboxylic acid to form a reversibly crosslinked polymer that is wet etch soluble.

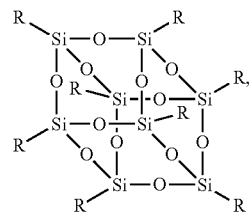

wherein R is:

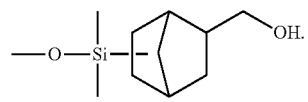

Figure 9:
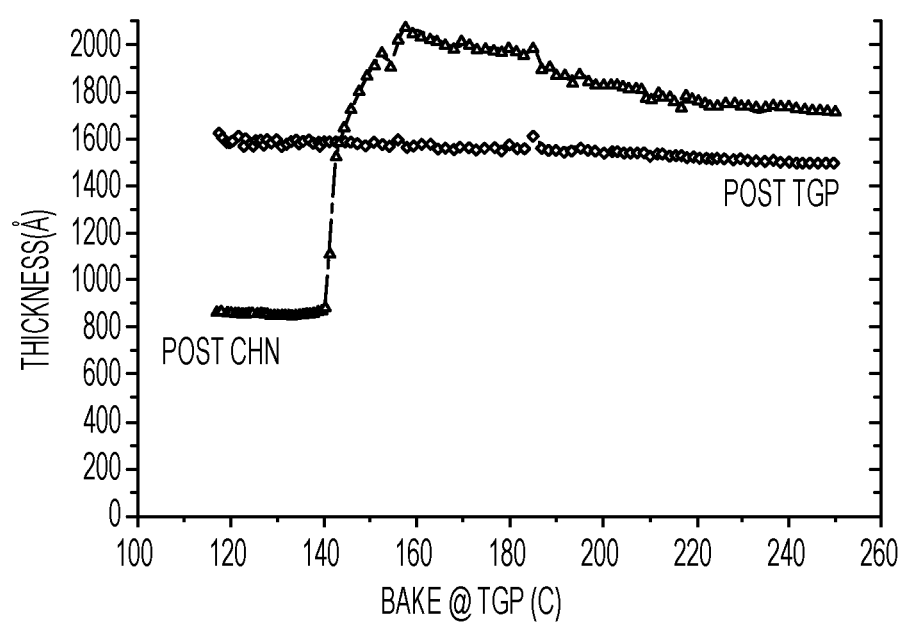
FIG. 9 graphically illustrates thickness as a function of high temperature bake, and the dissolution in cyclohexanone as a function of high temperature bake of a thin film of polyhedral silsequioxane including a secondary alcohol group in the presence of a dianhydride crosslinker as a function of temperature.

FIG. 9 graphically illustrates thickness as a function of high temperature bake and the dissolution in cyclohexanone as a function of high temperature bake of a thin film of polyhedral silsequioxane with the secondary alcohol group in the presence of a dianhydride crosslinker. As shown, the crosslinked silsequioxane was insoluble to cyclohexanone at temperatures greater than about 140° C., which is indicative that no intermixing will occur upon spin coating of the silicon containing hardmask layer onto the underlayer. The crosslinked polymer obtained within this temperature range was removed upon exposure to 1% tetramethyl ammonium hydroxide in propylene glycol methyl ether acetate for 3 minutes at 40° C., which is indicative of the reversibility of the ester functionalized crosslinking.

Figure 10:
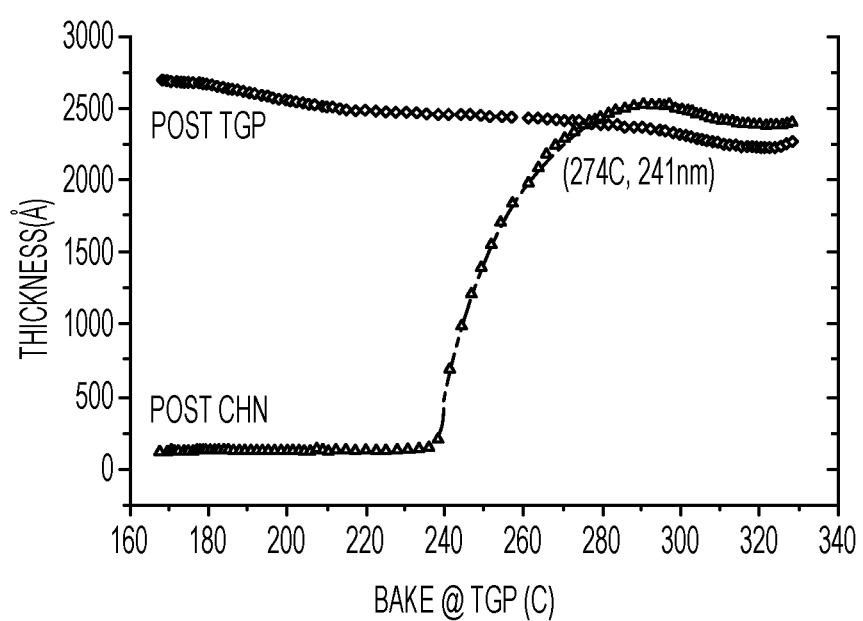
FIG. 10 graphically illustrates thickness as a function of high temperature bake, and dissolution in cyclohexanone as a function of high temperature bake of a thin film of polyhedral silsequioxane including a secondary alcohol group in the absence of a dianhydride crosslinker.

FIG. 10 graphically illustrates thickness as a function of high temperature bake and the dissolution in cyclohexanone as a function of high temperature bake of a thin film of polyhedral silsequioxane with the secondary alcohol group in the absence of a dianhydride crosslinker. As shown, crosslinking in the absence of the dianhydride occurred at markedly higher temperature of about 275° C. The reaction was not reversible, i.e., the crosslinked silsequioxane is insoluble upon exposure to 1% tetramethyl ammonium hydroxide in propylene glycol methyl ether acetate for 3 minutes at 40° C.

Phenolic polymers/oligomers, e.g., novolaks, did not react with the dianhydride and crosslinked at relatively high temperatures by some other mechanism, wherein the crosslinking was not reversible as evidenced by the lack of any measureable dissolution in a basic wet etchant.

The wet etchant is not intended to be limited and are generally an acidic solution or a basic solution in a polar solvent or a polar solvent and water mixture, or combinations thereof and can include organics and/or an inorganic salts. Suitable bases include, but are not limited to, ammonium hydroxide, tetraethyl ammonium hydroxide, tetramethylammonium hydroxide (TMAH), choline hydroxide, potassium hydroxide, sodium hydroxide as well as combinations including at least one of the foregoing bases. Suitable solvents include glycols such as PGMEA, methoxyethoxypropionate, ethoxyethoxypropionate, and gamma-butyrolactone, cyclohexanone, 2-heptanone, water, alcohols, and a combination including at least one of the foregoing solvents.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A layered structure comprising:
   a substrate;
   an underlayer comprising a reversibly crosslinked polymer and/or oligomer interconnected by ester functionalities, wherein the reversibly crosslinked polymer and/or oligomer is a silicon based silsequioxane;
   a silicon-containing mask overlaying the underlayer; and
   a photoresist overlaying the silicon-containing hardmask layer.

2. The layered structure of claim 1, wherein the reversibly crosslinked polymer is a carbon based acrylate copolymer.

3. The layered structure of claim 1, further comprising an anti-reflective coating intermediate the photoresist and the silicon-containing hardmask.

4. A multilayer lithographic method comprising:
   coating an underlayer composition having a planar upper surface onto a surface of a substrate, wherein the underlayer composition comprises a polymer and/or oligomer comprising terminal alcohol groups, a multifunctional anhydride, and a solvent;
   heating the underlayer to form an ester functionality between the multifunctional anhydride and the terminal alcohol groups;
   coating a silicon-containing hardmask on the underlayer layer;
   coating a photoresist on the silicon-containing hardmask;
   patterning the photoresist with a light source and a developer;
   transferring the photoresist pattern into the silicon-containing hardmask;
   transferring the silicon-containing hardmask pattern into the underlayer, wherein transferring comprises contacting the underlayer with a wet etchant and removing the underlayer at a rate greater than the silicon containing hardmask; and
   transferring the patterned underlayer into the substrate.

5. The method of claim 4, wherein the wet etchant comprises an acidic solution or a basic solution in a polar solvent or a polar solvent and water mixture, or combinations thereof.

6. The method of claim 4, wherein the multifunctional anhydride is a difunctional anhydride comprising a tetracarboxylic acid dianhydride represented by formula (i):

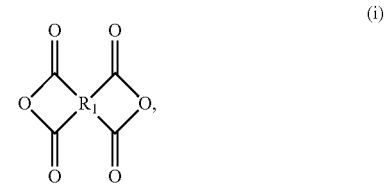

wherein $R_1$ is a tetravalent group having at least 4 carbons.

7. The method of claim 4, wherein the multifunctional anhydride comprises a dianhydride of pyromellitic acid, 2,2-bis(3,4-dicarboxyphenyl) propane, bis(3,4-dicarboxyphenyl) ether, bis(3,4-dicarboxyphenyl) sulfone, 3,3',4,4'-benzophenone tetracarboxylic acid, 3,3',4,4'-biphenyltetracarboxylic acid, 2,2',3,3'-biphenyltetracarboxylic acid, 1,2,5,6-naphthalene tetracarboxylic acid, 2,3,6,7-naphthalene tetracarboxylic acid, 3,4,9,10-perylene tetracarboxylic acid, 2,2',6,6'-biphenyl tetracarboxylic acid, 2,2-bis(3,4-dicarboxyphenyl) hexafluoropropane or mixtures thereof.

8. The process of claim 4, wherein the substrate comprises topography and the underlayer fills gaps provided by the topography.

9. The method of claim 4, wherein the polymer including the terminal alcohol groups comprises an acrylate copolymer.

10. The method of claim 4, wherein the oligomer including terminal alcohol groups comprises a silsequioxane.

11. The method of claim 4, further comprising coating an antireflective coating between the photoresist and the silicon containing hardmask.

12. The method of claim 4, wherein the polymer comprises a poly(4-hydroxystyrene-co-2-hydroxyethyl methacrylate) polymer and the multifunctional anhydride comprises a dianhydride of pyromellitic acid.

13. The method of claim 4, wherein the oligomer is of a formula $[RSiO_{3/2}]_8$, wherein the R group includes the terminal alcohol groups and the multifunctional anhydride comprises the dianhydride of pyromellitic acid.

14. A method for forming an underlayer in a multilayer lithography patterning scheme, the process comprising:
   coating an underlayer composition having a planar upper surface onto a surface of a substrate, wherein the underlayer composition comprises a crosslinkable polymer including terminal alcohol groups, a multifunctional anhydride, and a solvent; and heating the underlayer composition to form an ester functionality between the multifunctional anhydride and the terminal alcohol groups insoluble in cyclohexanone.

15. The method of claim 14, wherein the crosslinkable polymer comprises a poly(4-hydroxystyrene-co-2-hydroxyethyl methacrylate) polymer and the multifunctional anhydride comprises a dianhydride of pyromellitic acid.

16. The method of claim 14, wherein the polymer is of a formula $[RSiO_{3/2}]_8$, wherein the R group includes the terminal alcohol groups and the multifunctional anhydride comprises a dianhydride of pyromellitic acid.

17. The method of claim 14, wherein the multifunctional anhydride is a tetracarboxylic acid dianhydride represented by formula (i):

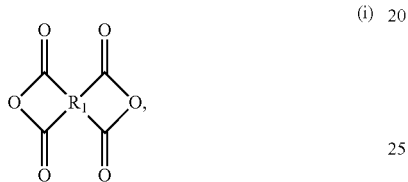

(i)

wherein $R_1$ is a tetravalent group having at least 4 carbons.

* * * * *